(12) United States Patent
Kong et al.

(10) Patent No.: US 10,978,407 B2
(45) Date of Patent: Apr. 13, 2021

(54) STIFFENER-INTEGRATED INTERCONNECT BYPASSES FOR CHIP-PACKAGE APPARATUS AND METHODS OF ASSEMBLING SAME

(71) Applicant: Intel Corporation, Santa Clara, CA (US)

(72) Inventors: Jackson Chung Peng Kong, Tanjung Tokong (MY); Bok Eng Cheah, Bukit Gambir (MY); Howard L. Heck, Hillsboro, OR (US); Seok Ling Lim, Kulim (MY); Jenny Shio Yin Ong, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 16/402,522

(22) Filed: May 3, 2019

(65) Prior Publication Data
US 2020/0006246 A1    Jan. 2, 2020

(30) Foreign Application Priority Data
Jun. 29, 2018 (MY) .............................. PI2018001228

(51) Int. Cl.
| H01L 23/552 | (2006.01) |
| H01L 23/538 | (2006.01) |
| H01L 23/00 | (2006.01) |
| H01L 25/10 | (2006.01) |
| H01L 21/48 | (2006.01) |
| H01L 25/00 | (2006.01) |
| H01L 23/16 | (2006.01) |

(52) U.S. Cl.
CPC .......... *H01L 23/552* (2013.01); *H01L 21/486* (2013.01); *H01L 21/4853* (2013.01); *H01L 23/16* (2013.01); *H01L 23/5384* (2013.01); *H01L 23/5385* (2013.01); *H01L 23/5386* (2013.01); *H01L 23/5387* (2013.01); *H01L 23/5389* (2013.01); *H01L 23/562* (2013.01); *H01L 24/19* (2013.01); *H01L 24/20* (2013.01); *H01L 25/105* (2013.01); *H01L 25/50* (2013.01); *H01L 2224/214* (2013.01); *H01L 2225/1035* (2013.01); *H01L 2924/3025* (2013.01)

(58) Field of Classification Search
None
See application file for complete search history.

(56) References Cited

U.S. PATENT DOCUMENTS

| 2003/0080763 | A1* | 5/2003 | Yu ........................ G01R 1/07314 324/750.17 |
| 2019/0109122 | A1* | 4/2019 | Ong ........................ H01L 21/4875 |
| 2020/0006166 | A1* | 1/2020 | Raorane ................ H01L 23/055 |
| 2020/0006247 | A1* | 1/2020 | Ong ........................ H01L 23/5226 |

* cited by examiner

*Primary Examiner* — Nduka E Ojeh
(74) *Attorney, Agent, or Firm* — Schwegman Lundberg & Woessner, P.A.

(57) ABSTRACT

A stiffener includes an integrated cable-header recess that couples a semiconductor package substrate flexible cable. The flexible cable connects to a device on a board without using interconnections that are arrayed through the board. A semiconductive die is coupled to the semiconductor package substrate and flexible cable through the cable-header recess.

22 Claims, 6 Drawing Sheets

STIFFENER-INTEGRATED INTERCONNECT BYPASSES FOR CHIP-PACKAGE APPARATUS AND METHODS OF ASSEMBLING SAME

PRIORITY APPLICATION

This application claims the benefit of priority to Malaysian Application Serial Number PI 2018001228, filed Jun. 29, 2018, which is incorporated herein by reference in its entirety.

FIELD

This disclosure relates to semiconductor package signal integrity and electromagnetic-interference amelioration that uses package stiffeners.

BACKGROUND

Connected components experience signal-integrity issues, as several connections through various structures are required to connect the components.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Disclosed bypass interconnects are useful for next-generation input-outputs (I/Os) such as 20G Thunderbolt®, 16G PCI3 Gen4 and 10G USB 3.1 and beyond. The bypass interconnects propagate above the motherboard and attenuation losses and multi-reflection noises are achieved at useful levels. Useful routing lengths are also achieved. CPU upgrading is achievable by using the bypass interconnect embodiments.

Disclosed embodiments include useful signal paths from original silicon to lateral devices through cable headers that are integral to semiconductor-package frame stiffeners. Because no through-motherboard routing is needed, signal-integrity performance is useful by avoiding vertical in-board interconnects that otherwise must be employed within the motherboard onto which the semiconductor package is to be mounted. These and other disclosed embodiments allow longer cables and improved flexibility of enabling solutions for several chipset configurations.

The cable header is also shielded in the integral cable-header recess in the stiffener, which shielding enhances electromagnetic interference (EMI) performance.

Figure 1:
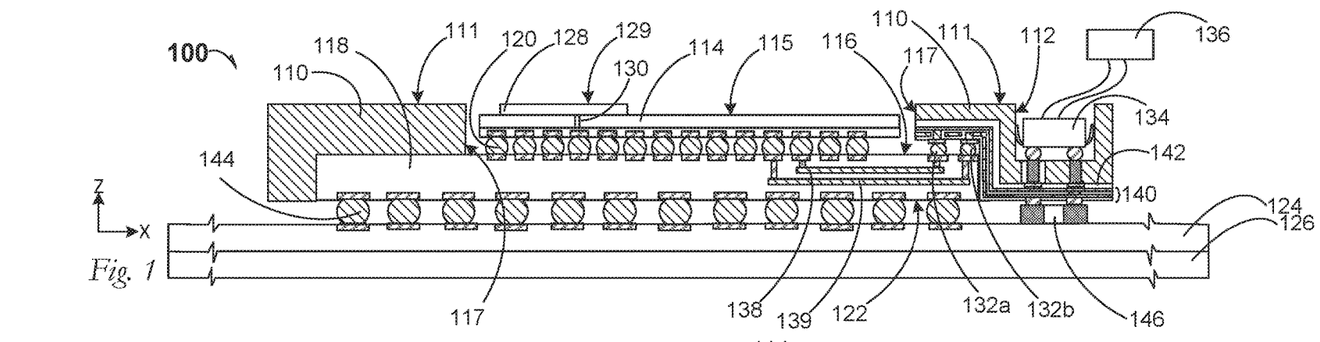
FIG. 1 is a cross-section elevation of a semiconductor device package that includes a frame stiffener with an integrated cable-header recess according to an embodiment.

FIG. 1 is a cross-section elevation of a semiconductor device package 100 that includes a frame stiffener 110 with an integrated cable-header recess 112 according to an embodiment. A frame stiffener is defined to include an opening or through-hole 117 in the structure of the frame stiffener 110, where the through hole 117 is large enough to accommodate a component such as a semiconductive device 114. As such, the component 114 is seen within an infield region of the frame stiffener 110, when the component 114 is disposed on a structure such as a semiconductor package substrate 118.

In an embodiment, a semiconductive device 114 is flip-chip mounted on a die side 116 of a semiconductor package substrate 118 by a ball array, one electrical bump of which is indicated by reference number 120. The semiconductor package substrate 118 also includes a land side 122 that faces a land 124 such as a motherboard 124 or printed wiring board 124 for a computing system. In an embodiment, the board 124 includes a physical and electrically insulative shell 126 such as the outer shell 126 of a hand-held computing system.

In an embodiment, a stacked semiconductive device 128 is coupled to the first semiconductive device 114 by a through-silicon via (TSV) 130.

The frame stiffener 110 abuts the semiconductor package substrate 118 on the die side 116. On the left of the drawing, the frame stiffener 110 physically touches the die side 116, and on the right of the drawing, the frame stiffener 110 is coupled to the semiconductor package substrate 118 by at least one electrical bump 132 (two indicated) such as a microball 132 that is seated on the die side 116. In an embodiment, the electrical bump 132 and the electrical bump 120 are the same size.

As illustrated, the integrated cable-header recess 112 accommodates a cable header 134 that is coupled to a cable 136. Electrical routing from the first semiconductive device 114 includes a trace 138 in the semiconductor package substrate 118, which trace 138 is coupled to an electrical bump 132. The electrical routing continues through a folded redistribution layer (fRDL) 140, which fRDL 140 conforms to the frame stiffener 110 by an fRDL adhesive 142, which is also folded onto the frame stiffener 110 as depicted on the right side of the drawing.

In an embodiment, where the land side 122 of the semiconductor package substrate 118 faces the board 124, the land side 122 includes a land-side ball array, one electrical bump of which is indicated by reference number 144. In an embodiment, a passive device 146 such as an upset capacitor 146 is seated upon the board 124 and the passive device 146 is also electrically coupled to the first semiconductive device 114 by separate routing through the fRDL 140. Accordingly, where the passive device 146 is wedged between the frame stiffener 110 and the board 124, not only can the passive device 146 function as a package-edge capacitor 146, but also it adds overall stiffness to the semiconductor device package 100. Additionally, the passive device 146 is electrically shielded from both the cable header 134 and the first semiconductive device 114 because is it under the frame stiffener 110.

Figure 2:
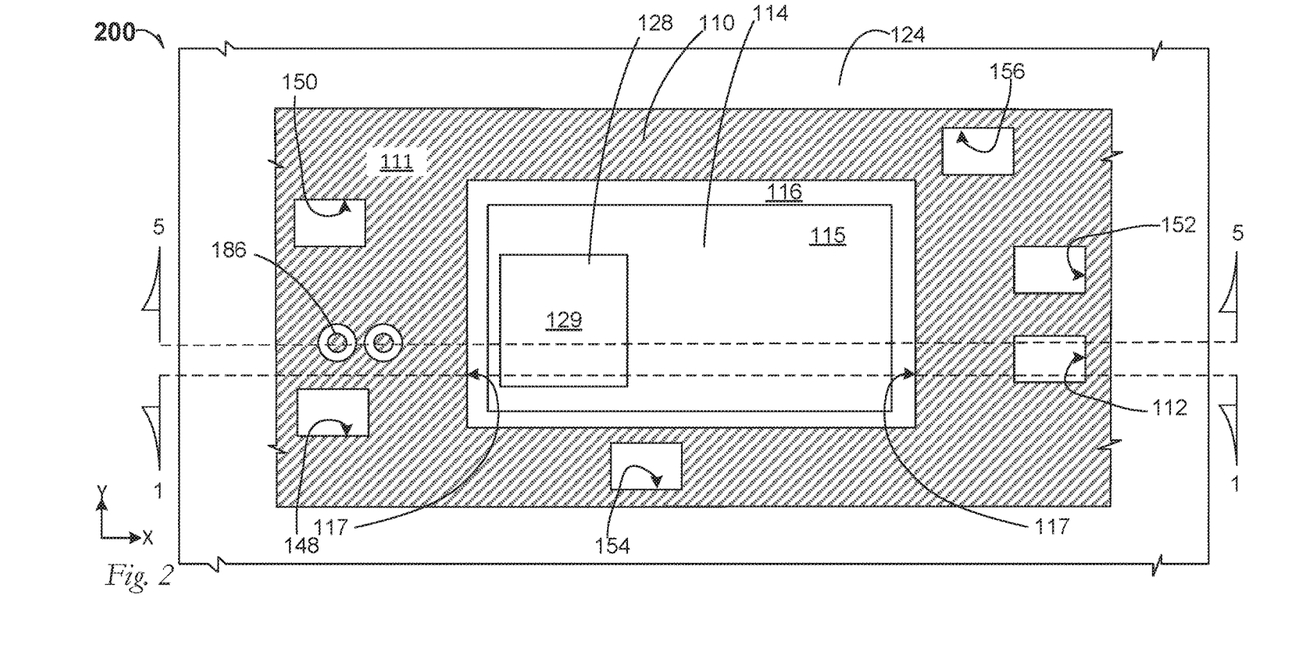
FIG. 2 is a top plan of the semiconductor device package depicted in FIG. 1 according to an embodiment.

FIG. 2 is a top plan 200 of the semiconductor device package 100 depicted in FIG. 1 according to an embodiment. The cross-section elevation depicted in FIG. 1 is taken along the section line 1-1 as seen in FIG. 2, but the cable header 134 is omitted. The frame stiffener 110 includes a frame-stiffener body that in plan view, resembles a rectangular frame such as is recognizable as a plain picture frame. Frame-stiffener body deviations from the outlines of a plain frame, may include the location of the through hole 117, whether the through hole 117 is symmetrically centered with respect to outer frame boundaries, or it appears specialized to accommodate infield-located devices or the location of a given integrated cable-header recess.

In an embodiment, the frame stiffener 110 surrounds the first semiconductive device 114 with the through hole 117, which allows the first semiconductive device 114 to be seen in an infield created by the through hole 117 and the die side 116 of the semiconductor package substrate 118. The frame stiffener 110 also exhibits the integrated cable-header recess 112 that is set within the frame stiffener 110 near the right edge.

In an embodiment, the frame stiffener 110 is depicted with abbreviated Y-direction presence, and the board 124 is depicted with at least and abbreviated X-direction presence.

The first stacked semiconductive device 128 is seated on a backside 115 of the first semiconductive device 114. In an embodiment, more than one stacked semiconductive device is located on the backside 115 of the first semiconductive device.

In an embodiment, more than one integrated cable-header recess is present. Where the frame stiffener 110 includes a top surface 111, the integrated cable-header recess 112 is a first integrated cable-header recess 112, and a subsequent integrated cable-header recess 148 is located across from the first semiconductive device 114. In an embodiment, respective third, fourth, fifth and sixth recesses 150, 152, 154 and 156 are present.

Reference is made to FIG. 1. In an embodiment, where the first stacked semiconductive device 128 is present, a die backside 129 of the first stacked semiconductive device 128, extends in the Z-direction, no more than the top surface 111 of the frame stiffener 110. In an embodiment where only the first semiconductive device 114 is present, the die backside 115 of the first semiconductive device 114, extends in the Z-direction, no more than the top surface 111 of the frame stiffener 110. In either embodiment, the top surface 111 is at least the highest (Z-direction) extending structure to protect semiconductive devices that are seated on or above the die side 116 of the semiconductor package substrate 118.

Figure 5:
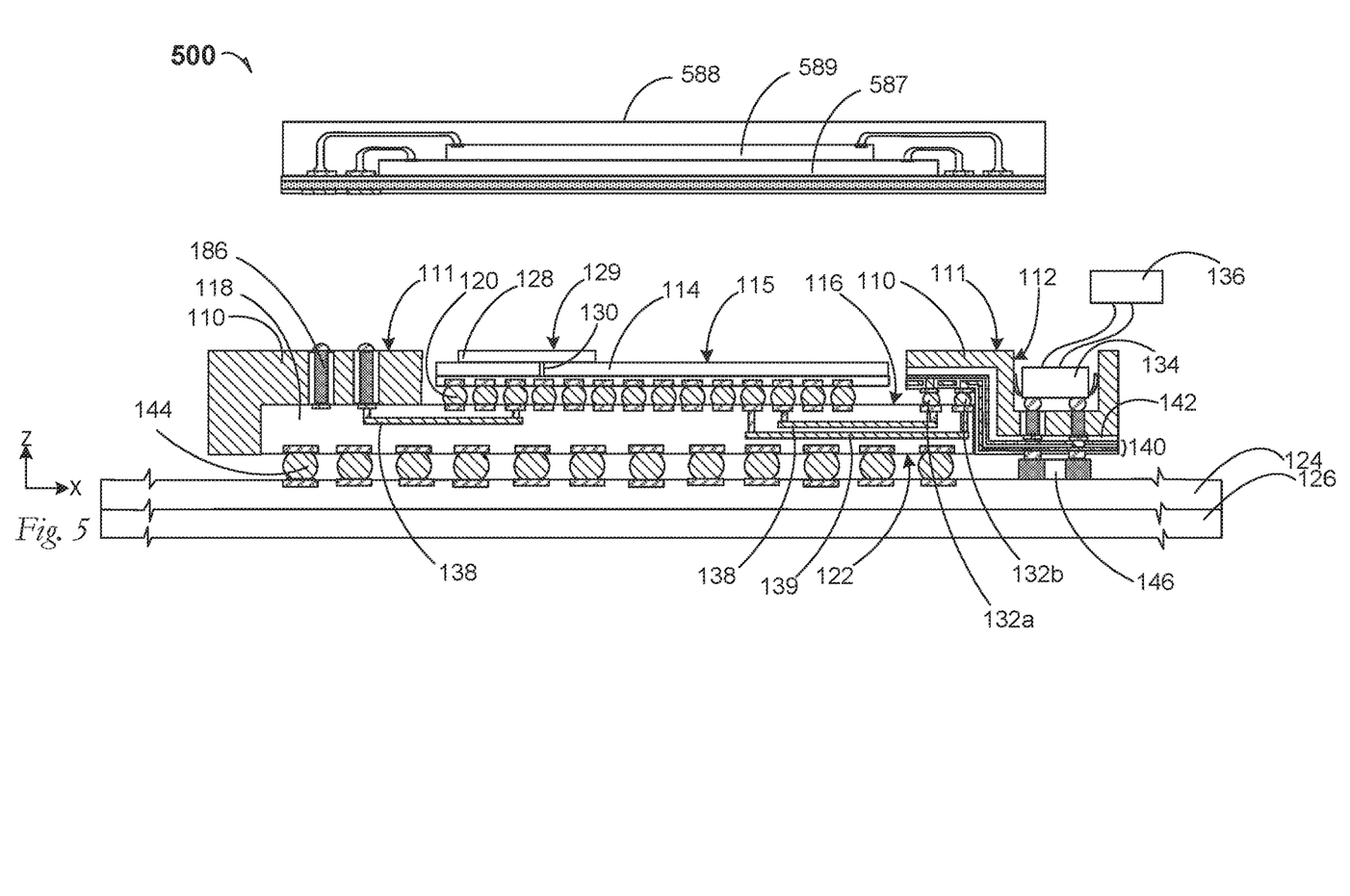
FIG. 5 is a cross-section elevation of the semiconductor a semiconductor device package depicted in FIG. 1 according to an embodiment.

In an embodiment, the top surface 111 acts as a seat for a package-on-package (POP) module such as is described and illustrated in FIG. 5. For through-frame-stiffener interconnects TFSIs, at least one TFSI 186 is used (see FIGS. 2 and 5).

Figures 1A, 1B, 1C:
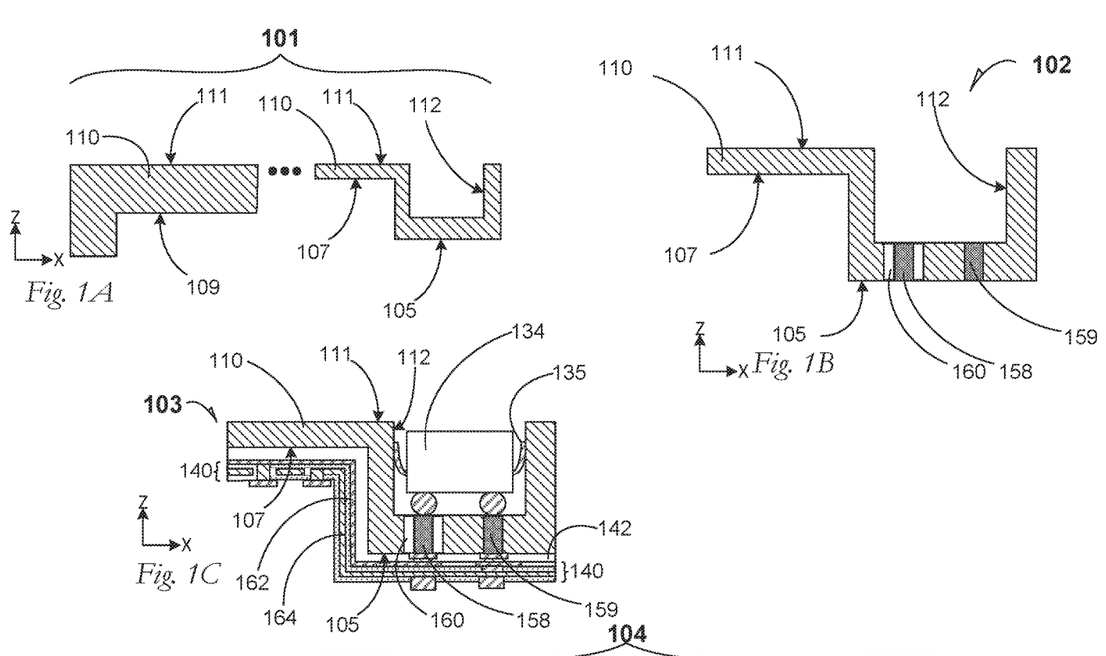
FIG. 1A is a detail extraction of the frame stiffener depicted in FIGS. 1 and 2, during processing according to an embodiment.
FIG. 1B is a detail extraction of the section of the frame stiffener depicted in FIG. 1A that includes the integrated cable-header recess during processing according to an embodiment.
FIG. 1C is a detail extraction of the section of the frame stiffener depicted in FIG. 1B that includes an integrated cable-header recess during processing according to an embodiment.

FIG. 1A is a detail extraction 101 of the frame stiffener 110 depicted in FIGS. 1 and 2, during processing according to an embodiment. Processing to fabricate the frame stiffener 110 includes starting with a useful metal blank such as stainless steel or electronics-grade heat-sink copper, and stamping the frame stiffener 110 to create the top surface 111, as well as a die-side ledge 109 for seating on e.g., the die side 116 of the semiconductor package substrate 118 depicted in FIGS. 1 and 2. Where an integrated cable-header recess 112 is to be fabricated, stamping or machining is done to open the recess 112. Further, the section of the frame stiffener 110 that includes an integrated cable-header recess 112, is also processed to achieve a die-side interconnect surface 107 to be seated above the die side 116 of a semiconductor package substrate 118, and a land-side interconnect surface 105 to optionally be physically coupled to a board 124. The die-side interconnect surface 107 is adjacent the integrated cable-header recess 112, when viewed in a horizontal (X-direction) scan.

FIG. 1B is a detail extraction 102 of the section of the frame stiffener 110 that includes the integrated cable-header recess 112 during processing according to an embodiment.

In an embodiment, a through-frame-stiffener interconnect TFSI 158 has been formed in the integrated cable-header recess 112 by drilling and inserting a via dielectric 160 to insulate the TFSI 158 from the frame stiffener 110. As depicted, two or more TFSIs 158 are formed through the land-side interconnect surface 105 of the frame stiffener 110.

FIG. 1C is a detail extraction 103 of the section of the frame stiffener 110 that includes an integrated cable-header recess 112 during processing according to an embodiment. In an embodiment, the fRDL 140, depicted in FIG. 1, is assembled to the frame stiffener 110 by folding the fRDL 140 onto the die-side interconnect surface 107 and onto the land-side interconnect surface 105. The fRDL adhesive 142 is used to bond the fRDL 140 onto the frame stiffener 110. Additionally, the fRDL 140 has two traces, with a cable-header trace 162 that is coupled to the TFSI 158, and a land-side-connecting trace 164 that is for connecting to devices such as the passive device 146 depicted in FIG. 1.

In an embodiment, ground stitching of the cable header 134 is accomplished such as by ground contact 135. In an embodiment, the ground contact 135 is a flexible electrically conductive material that uses spring-metal memory to make a compression ground contact between cable header 134 and the frame stiffener 110 within the integrated cable-header recess 112. In an embodiment, where the ground contact 135 uses a spring-metal material, it may be referred to as a wing-spring thing 135.

In an embodiment, 3D electromagnetic field modeling is done to demonstrate electromagnetic interference (EMI) shielding effectiveness of the cable header 134 being ground-stitched to- and shielded by the integrated cable-header recess 112 within the frame stiffener 110. *Can we quantify how the EMI is suppressed by the cable header 134, such as the data shows within the IDF FIG. 2, something like "At a horizontal distance, X, from the cable header 134, the E Field is reduced from about 0.8571 e +0001 Volt/unit area, to about zero." ?* The shielding usefulness of the cable header 134 being inserted into and ground-stitched to the integrated cable-header recess 112 allows for useful employment of sensitive circuitry such as a global-positioning system (GPS) device.

Figure 1D:
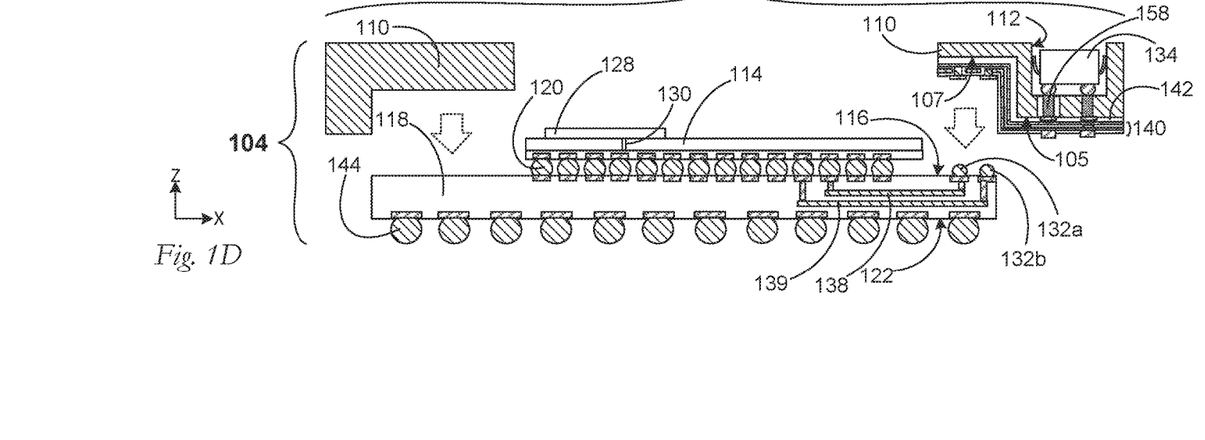
FIG. 1D is a cross-section elevation of a semiconductor device package, where a frame stiffener and a semiconductor package substrate are being assembled with a folded redistribution layer according to an embodiment.

FIG. 1D is a cross-section elevation of a semiconductor device package 104, where a frame stiffener 110 and a semiconductor package substrate 118 are being assembled with an fRDL 140 according to an embodiment. Directional arrows illustrate the frame stiffener 110 being directed onto the semiconductor package substrate 118.

A first semiconductive device 114 and a first stacked semiconductive device 128 are seated above the die side 116 of the semiconductor package substrate 118. At least one electrical bump 132, such as a microball 132 is configured to be coupled to the fRDL, 140 where it is attached to the die-side interconnect surface 107 with an adhesive 142.

After assembly of the frame stiffener 110 to the semiconductor package substrate 118, the assembly depicted in FIG. 1D is coupled to a land such as the board 124 depicted in FIG. 1.

Figure 3:
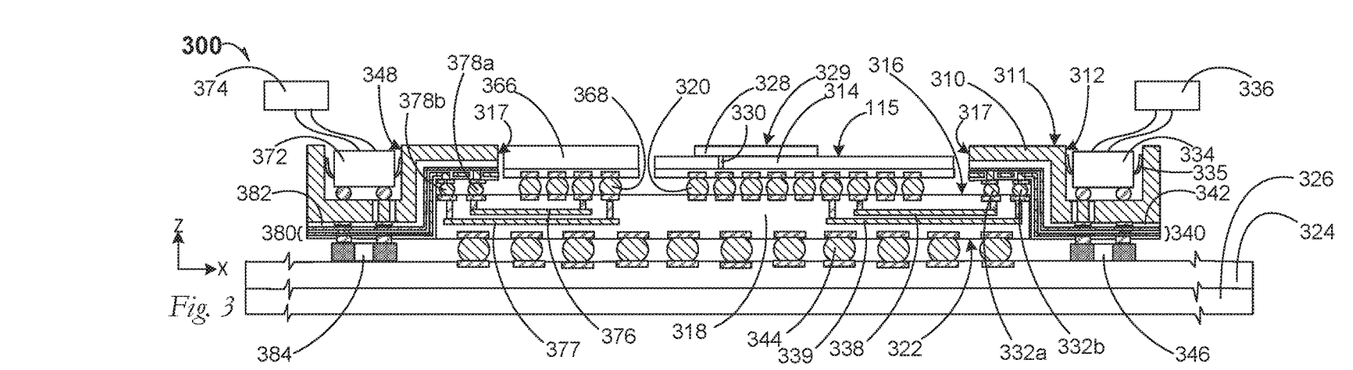
FIG. 3 is a cross-section elevation of a semiconductor device package that includes a frame stiffener with multiple integrated cable-header recesses according to an embodiment.

FIG. 3 is a cross-section elevation of a semiconductor device package 300 that includes a frame stiffener 310 with multiple integrated cable-header recesses 312 and 348 according to an embodiment. A frame stiffener is defined to include an opening or through-hole 317 in the structure of the frame stiffener 310, where the through hole 317 is large enough to accommodate a component such as a semiconductive device 314.

In an embodiment, a first semiconductive device 314 is flip-chip mounted on a die side 316 of a semiconductor package substrate 318 by a ball array, one electrical bump of which is indicated by reference number 320. In an embodiment, a subsequent semiconductive device 366 is flip-chip mounted on the die side 316 of the semiconductor package substrate 318 by a ball array, one electrical bump of which is indicated by reference number 368.

The semiconductor package substrate 318 also includes a land side 322 that faces a land 324 such as a motherboard 324 or printed wiring board 324 for a computing system. In an embodiment, the board 324 includes a physical and electrically insulative shell 326 such as the outer shell 326 of a hand-held computing system.

In an embodiment, a stacked semiconductive device 328 is coupled to the first semiconductive device 314 by a TSV 330.

The frame stiffener 310 is coupled to the semiconductor package substrate 318 on the die side 316 on the right of the drawing by at least one electrical bump 332 (two indicated) such as a microball 132 that is seated on the die side 116.

As illustrated, a first integrated cable-header recess 312 accommodates a first cable header 334, which is coupled to a flexible first cable 336. In an embodiment, the first cable header 334 is ground-stitched to the frame stiffener 310 such as by a flexible ground 335.

Electrical routing from the first semiconductive device 314 includes a first trace 338 in the semiconductor package substrate 318, which first trace 338 is coupled to a first electrical bump 332. The electrical routing continues through a first folded redistribution layer (fRDL) 340, which first fRDL 340 conforms to the frame stiffener 310 by a first fRDL adhesive 342, which is also folded onto the frame stiffener 310 as depicted on the right side of the drawing.

In an embodiment, a subsequent integrated cable-header recess 348 accommodates a subsequent cable header 372, which is coupled to a subsequent cable 374. Electrical routing from the subsequent semiconductive device 366 includes a subsequent trace 376 in the semiconductor package substrate 318, which subsequent trace 376 is coupled to a subsequent electrical bump 378. The electrical routing continues through a subsequent folded redistribution layer (fRDL) 380, which subsequent fRDL 380 conforms to the frame stiffener 310 by a subsequent fRDL adhesive 382, which is also folded onto the frame stiffener 310 as depicted on the left side of the drawing.

In an embodiment, where the land side 322 of the semiconductor package substrate 318 faces the board 324, the land side 322 includes a land-side ball array, one electrical bump of which is indicated by reference number 344.

In an embodiment, a first passive device 346 such as an upset capacitor 346 is seated upon the board 324 and the first passive device 346 is also electrically coupled to the first semiconductive device 314 by separate routing through the first fRDL 340. Accordingly where the first passive device 346 is wedged between the frame stiffener 310 and the board 326, not only can the first passive device 346 function as a package-edge capacitor 346, but also it adds overall stiffness to the semiconductor device package 300. Additionally, the passive device 346 is electrically shielded from both the first cable header 334 and the first semiconductive device 314 because is it under the frame stiffener 310.

In an embodiment, a subsequent passive device 384 such as an upset capacitor 384 is seated upon the board 324 and the subsequent passive device 384 is also electrically coupled to the subsequent semiconductive device 366 by separate routing through the subsequent fRDL 380. Accordingly, where the subsequent passive device 384 is wedged between the frame stiffener 310 and the board 326, not only can the subsequent passive device 384 function as a package-edge capacitor 384, but also it adds overall stiffness to the semiconductor device package 300. Additionally, the subsequent passive device 384 is electrically shielded from both the subsequent cable header 372 and the subsequent semiconductive device 366 because is it under the frame stiffener 310.

In an embodiment, only the first semiconductive device 314 is present, and it is coupled to both the first cable header 334 and to the subsequent cable header 372, where useful computations from the first semiconductive device 314 are divided and routed to each of the first cable header 334 and to the subsequent cable header 372.

Figure 4:
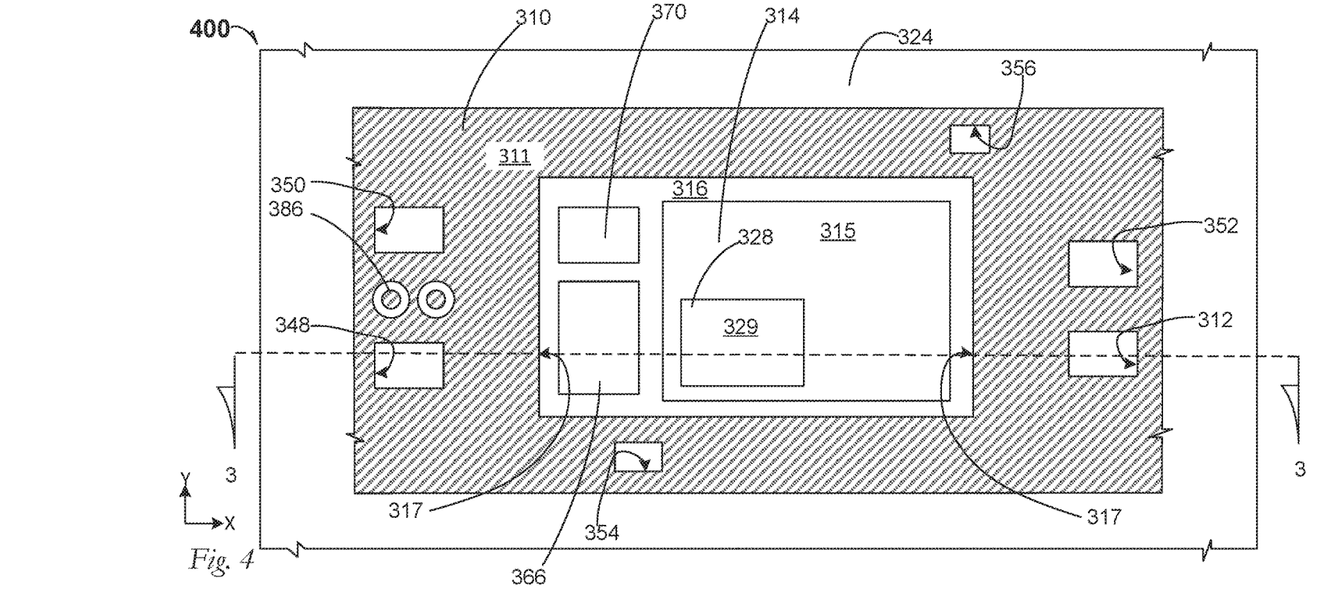
FIG. 4 is a top plan of the semiconductor device package depicted in FIG. 3 according to an embodiment.

FIG. 4 is a top plan 400 of the semiconductor device package 300 depicted in FIG. 3 according to an embodiment. The cross-section elevation depicted in FIG. 3 is taken along the section line 3-3 as seen in FIG. 4, but the first and subsequent cable headers 334 and 372 are omitted.

In an embodiment, the frame stiffener 310 includes the through-hole 317 that surrounds the first semiconductive device 314 as well as the subsequent semiconductive device 366. In an embodiment, a third semiconductive device 370 is also seated on the die side 316 of the semiconductor package substrate 318. In an embodiment, the first integrated cable-header recess 312 is set within the frame stiffener 310 near the right edge, and the subsequent integrated cable-header recess 348 is set within the frame stiffener 310 near the left edge. The semiconductor package substrate die side 316 is visible between the first semiconductive device 314 and the frame stiffener 310. The frame stiffener 310 is depicted with abbreviated Y-direction presence, and the board 324 is depicted with at least and abbreviated X-direction presence.

In an embodiment, a stacked semiconductive die 328 is located on the backside 315 of the first semiconductive device 314. In an embodiment, the several semiconductive devices 314, 328, 366 and 370 are part of a computing system chipset. In an embodiment, the first semiconductive device 314 is a central processor, the first stacked semiconductive device 328 is a memory die, the subsequent semiconductive device 366 is a process-controller hub 366, and the third semiconductive device 370 is a baseband processor 370.

In an embodiment, more than the two integrated cable-header recess 312 and 348 are present. Where the frame stiffener 310 includes a top surface 311, the first integrated cable-header recess 312 is a first integrated cable-header recess 312, the subsequent integrated cable-header recess 348 is located across from the first semiconductive device 314, and the subsequent integrated cable-header recess 348 is located near the subsequent semiconductive device 366. In an embodiment, a third recess 350 is configured near the third semiconductive device 370 to provide coupling through the semiconductor package substrate 318 to a third cable header (not illustrated). Similarly, fourth, fifth and sixth recesses 352, 354 and 356 are present.

Reference is made to FIG. 3. In an embodiment, where the first stacked semiconductive device 328 is present, a first stacked-die backside 329 extends in the Z-direction, no more than the top surface 311 of the frame stiffener 310. In an embodiment where no stacked die is present, the first die backside 315 of the first semiconductive device 314, extends in the Z-direction, no more than the top surface 311 of the frame stiffener 310. In either embodiment, the top surface 311 is at least the highest (Z-direction) extending structure, to protect semiconductive devices that are seated on or above the die side 316 of the semiconductor package substrate 318.

In an embodiment, the top surface 311 acts as a seat for a package-on-package (POP) module such as is described and illustrated in FIG. 5. For through-frame-stiffener interconnects TFSIs, at least one TFSI 386 is used.

FIG. 5 is a cross-section elevation 500 of the semiconductor a semiconductor device package 100 depicted in FIG. 1 and taken from FIG. 1 along the section line 5-5 according to an embodiment. An insulated through-frame-stiffener interconnect (TFSI) 186 is drilled in the frame stiffener 110 as illustrated on the left side of the drawing, in order to couple with a package-on-package (POP) module 588 according to an embodiment. Where the top surface 111 of the frame stiffener 110 allows, the POP module 588 is seated on the top surface 111 and the POP module 588 is electrically coupled through the insulated through-frame-stiffener interconnect 186. As illustrated, both the stacked semiconductive device backside 129 and the first semiconductive device backside surface 115 are below or no higher than the top surface 111 of the frame stiffener 110.

In an embodiment, the POP module 588 includes at least one semiconductive device 587. In an embodiment, the POP module 588 includes a first POP semiconductive device 587, and a subsequent POP semiconductive device 589. As illustrated in an embodiment, at least one semiconductive device is wire bonded and to be coupled to the TFSI 186.

Figure 6:
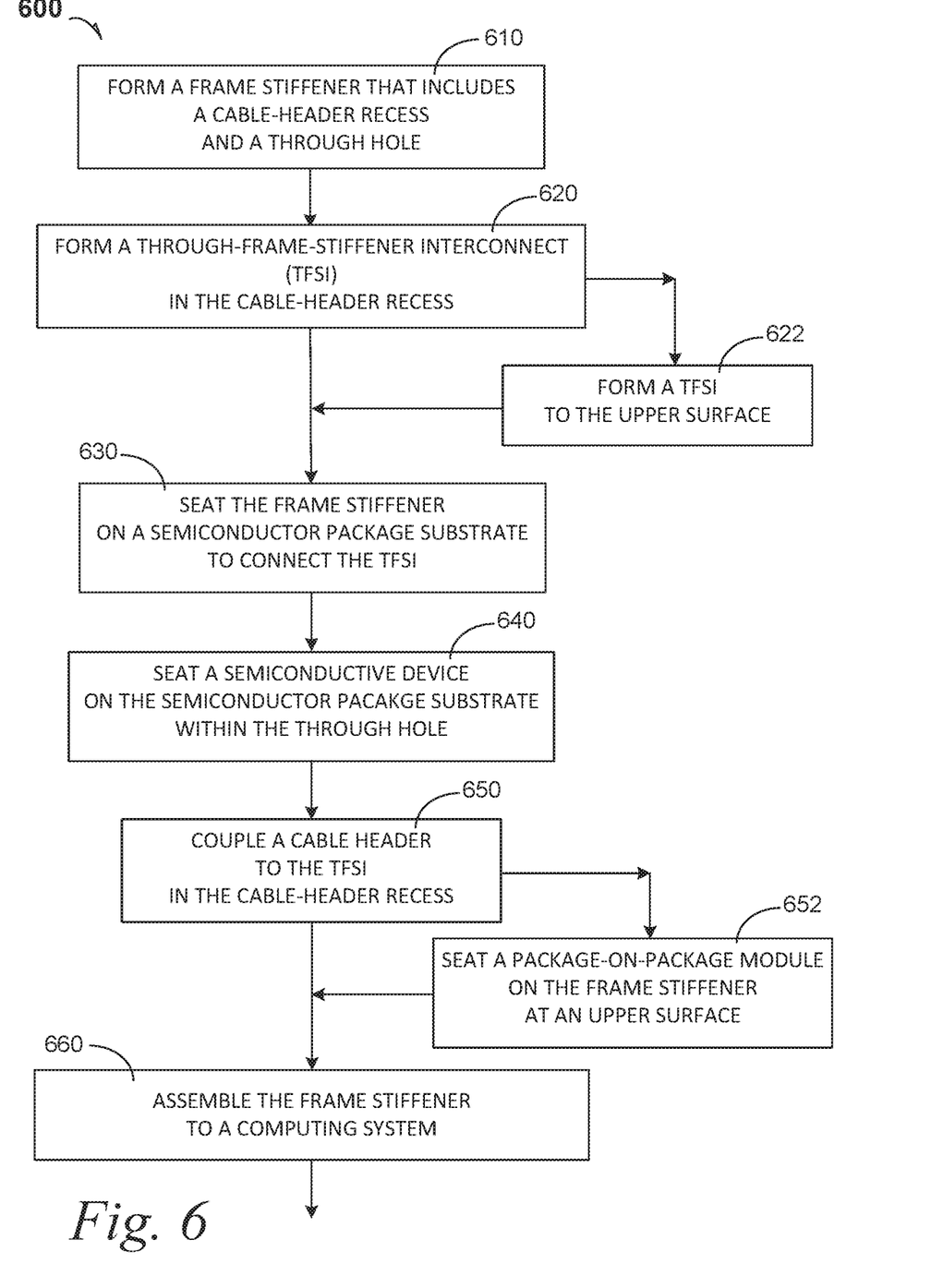
FIG. 6 is a process flow diagram according to an embodiment.

FIG. 6 is a process flow diagram 600 according to an embodiment.

At 610, the process includes forming a frame stiffener that includes a cable-recess and a through hole. In a non-limiting example embodiment, the frame stiffener 110 is stamped from a metal blank, to form the through hole 117, the metal blank is cold worked to form the die-side ledge 109, the die-side interconnect surface 107 and the land-side interconnect surface 105, and metal blank is machined to form the integrated cable-header recess 112.

At 620, the process includes forming a through-frame-stiffener interconnect (TFSI) in the cable-header recess. In a non-limiting example embodiment, a TFSI is drilled in the cable-header recess 112, and a TFSI 158 is formed within a via dielectric 160.

At 622, the process includes forming a through-frame-stiffener interconnect (TFSI) in the frame stiffener at an upper surface of the frame stiffener. In a non-limiting example embodiment, the TFSI 186 is drilled in the frame stiffener 110 to communicate to the upper surface 111 and the die-side ledge 109, and an insulated TFSI 186 is formed in the frame stiffener 110.

At 630, the process includes seating the frame stiffener on a semiconductor package substrate to connect the TFSI in the cable-header recess. In a non-limiting example embodiment, the frame stiffener 110, depicted in FIG. 1D is being seated onto the semiconductor package substrate 118, where it seats on the left of the drawing at the upper surface 116, and where it seats by electrical coupling to the electrical bump 132 on the right of the drawing.

At 640, the process includes seating a semiconductive device on the semiconductor package substrate within the through hole in the frame stiffener. In a non-limiting example embodiment, the semiconductive device 314 is already on the semiconductor package substrate 378, and it has been tested prior to seating the frame stiffener 310, but the positioning of the first semiconductive device 314 anticipates being exposed within the through hole 317 within the infield that is exposed part of the die side 316.

At 650, the process includes coupling a cable header to the through-frame-stiffener interconnect that is in the cable-header recess.

At 652, the process includes seating a package-on-package module on the frame stiffener at the upper surface.

At 660, the process includes assembling the frame stiffener to a computing system.

Figure 7:
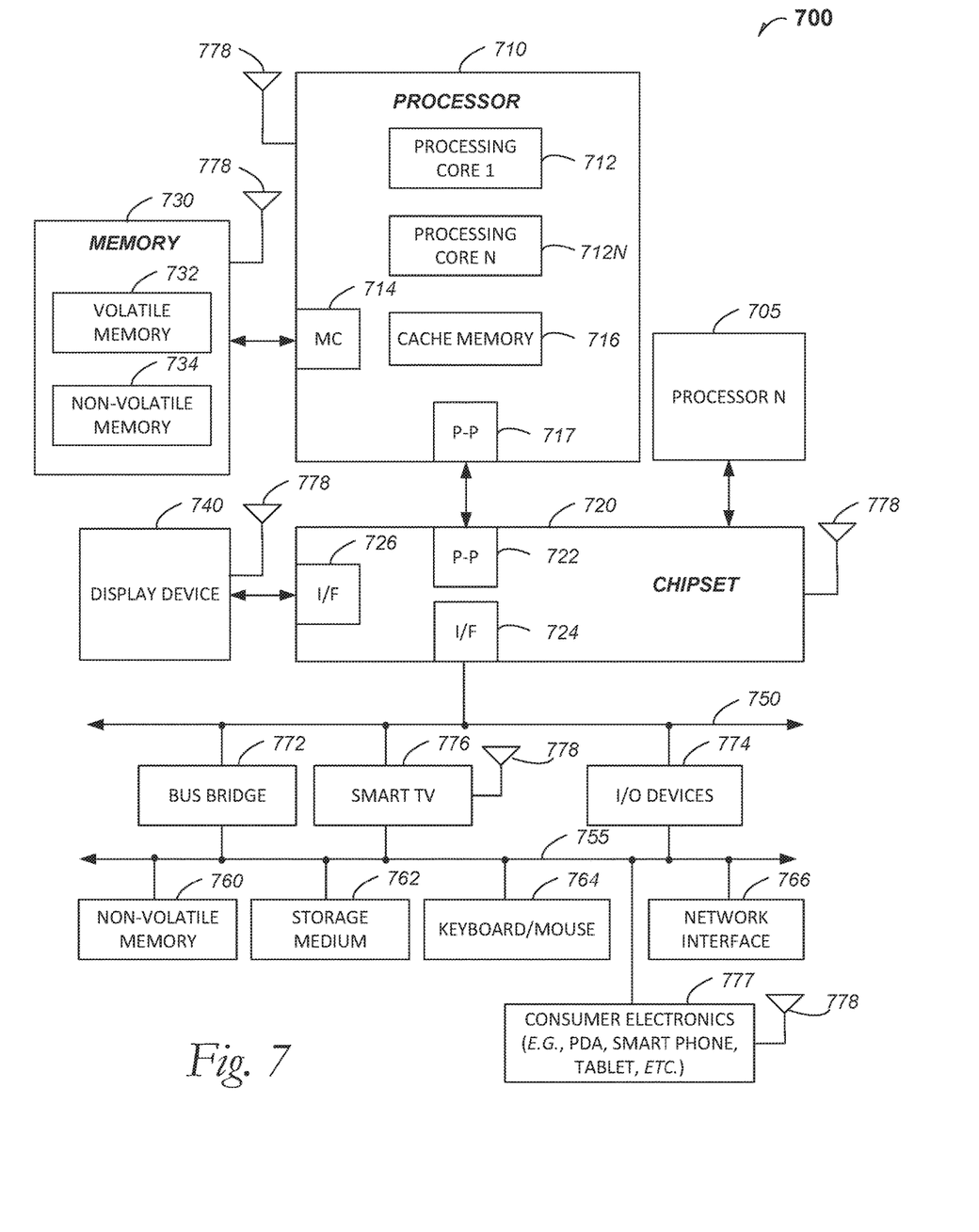
FIG. 7 is included to show an example of a higher-level device application for the disclosed embodiments.

FIG. 7 is included to show an example of a higher-level device application for the disclosed embodiments. The cable header in frame-stiffener recess embodiments may be found in several parts of a computing system. In an embodiment, the cable header in a frame-stiffener recess apparatus is part of a communications apparatus such as is affixed to a cellular communications tower. The cable header in a frame-stiffener recess apparatus may also be referred to as frame stiffener incorporating shielded cable-header recess apparatus. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes cable header in a frame-stiffener recess apparatus embodiments.

In an embodiment, the processor 710 has one or more processing cores 712 and 712N, where 712N represents the Nth processor core inside processor 710 where N is a positive integer. In an embodiment, the electronic device system 700 using a cable header in a frame-stiffener recess apparatus embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the cable header in a frame-stiffener recess apparatus in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM, and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a cable header in a frame-stiffener recess apparatus embodiment as set forth in this disclosure. The chipset 720 enables the processor 710 to connect to other elements in the cable header in a frame-stiffener recess apparatus embodiments in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a cable header in a frame-stiffener recess apparatus in a system. Additionally, the chipset 720 connects to one or more buses 750 and 755 that interconnect various elements 774, 760, 762, 764, and 766. Buses 750 and 755 may be interconnected together via a bus bridge 772 such as at least one cable header in a frame-stiffener recess apparatus embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the cable header in a frame-stiffener recess apparatus embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have a broadcasting structure interface such as for affixing the cable header in a frame-stiffener recess apparatus to a cellular tower.

To illustrate the cable header in a frame-stiffener recess apparatus embodiments and methods disclosed herein, a non-limiting list of examples is provided herein:

Example 1 is a semiconductor package frame stiffener, comprising: a frame stiffener body including a top surface and a die-side ledge that is opposite the top surface, further including a die-side interconnect surface that is opposite the top surface, and further including a land-side interconnect surface that is parallel planar with the die-side interconnect surface; a through hole that communicates from the top surface to the die-side ledge, and from the top surface to the die-side interconnect surface; an integrated cable-header recess that communicates to the top surface, wherein the integrated cable-header recess is adjacent to the die-side interconnect surface and adjacent to the land-side interconnect surface; and a through-frame-stiffener interconnect (TFSI) that communicates from the land-side interconnect surface, through the frame stiffener and into the integrated cable-header recess.

In Example 2, the subject matter of Example 1 optionally includes a cable header electrically coupled to the TFSI.

In Example 3, the subject matter of any one or more of Examples 1-2 optionally include a cable header electrically coupled to the TFSI; and a flexible cable coupled to the cable header.

In Example 4, the subject matter of any one or more of Examples 1-3 optionally include a cable header electrically coupled to the TFSI; a flexible cable coupled to the cable header; a passive device opposite the integrated cable-header recess, wherein the passive device is coupled to a folded redistribution layer at the land-side interconnect surface; a semiconductor package substrate including a die side and a land side, wherein the die side is in contact with the die-side ledge; and a semiconductive device on the die side, wherein the semiconductive device is coupled to the TFSI through a folded redistribution layer that contacts the land-side interconnect surface and the die-side interconnect surface.

In Example 5, the subject matter of any one or more of Examples 1-4 optionally include a passive device opposite the integrated cable-header recess, wherein the passive device is coupled to a folded redistribution layer at the land-side interconnect surface.

In Example 6, the subject matter of any one or more of Examples 1-5 optionally include a cable header electrically coupled to the TFSI; a semiconductor package substrate including a die side and a land side, wherein the die side is in contact with the die-side ledge; and a semiconductive device on the die side, wherein the semiconductive device is coupled to the TFSI through a folded redistribution layer that contacts the land-side interconnect surface and the die-side interconnect surface.

In Example 7, the subject matter of any one or more of Examples 1-6 optionally include a cable header electrically coupled to the TFSI; a semiconductor package substrate including a die side and a land side, wherein the die side is in contact with the die-side ledge; a semiconductive device on the die side, wherein the semiconductive device is coupled to the TFSI through a folded redistribution layer that contacts the land-side interconnect surface and the die-side interconnect surface; and a first stacked semiconductive device on the semiconductive device, wherein the first stacked semiconductive device is coupled to the semiconductive device by a through-silicon via.

In Example 8, the subject matter of any one or more of Examples 1-7 optionally include a folded redistribution layer (fRDL) that is coupled to the frame stiffener body opposite the integrated cable-header recess at the land-side interconnect surface, and wherein the fRDL is also coupled opposite the top surface at the die-side interconnect surface.

In Example 9, the subject matter of any one or more of Examples 1-8 optionally include a semiconductor package substrate that includes a die side and a land side, wherein the frame stiffener contacts the semiconductor package substrate at the die-side ledge.

In Example 10, the subject matter of any one or more of Examples 1-9 optionally include a folded redistribution layer (fRDL) that is coupled to the frame stiffener body opposite the integrated cable-header recess at the land-side interconnect surface, and wherein the fRDL is also coupled opposite the top surface at the die-side interconnect surface; and a semiconductor package substrate that includes a die side and a land side, wherein the frame stiffener contacts the semiconductor package substrate at the die-side ledge, and wherein the fRDL is coupled to the die side by a trace within the semiconductor package substrate.

Example 11, the subject matter of any one or more of Examples 1-10 optionally include a folded redistribution layer (fRDL) that is coupled to the frame stiffener body opposite the integrated cable-header recess at the land-side interconnect surface, and wherein the fRDL is also coupled opposite the top surface at the die-side interconnect surface; and a semiconductor package substrate that includes a die side and a land side, wherein the frame stiffener is coupled to the semiconductor package substrate through the fRDL at the die-side interconnect surface.

In Example 12, the subject matter of any one or more of Examples 1-11, optionally include a folded redistribution layer (fRDL) that is coupled to the frame stiffener body opposite the integrated cable-header recess at the land-side interconnect surface, and wherein the fRDL is also coupled opposite the top surface at the die-side interconnect surface; a semiconductor package substrate that includes a die side and a land side, wherein the frame stiffener contacts the semiconductor package substrate at the die-side ledge; and wherein the frame stiffener is coupled to the semiconductor package substrate through the fRDL at the die-side interconnect surface.

In Example 13, the subject matter of any one or more of Examples 1-12 optionally include a folded redistribution layer (fRDL) that is coupled to the frame stiffener body opposite the integrated cable-header recess at the land-side interconnect surface, and wherein the fRDL is also coupled opposite the top surface at the die-side interconnect surface; a semiconductor package substrate that includes a die side and a land side, wherein the frame stiffener contacts the semiconductor package substrate at the die-side ledge; wherein the frame stiffener is coupled to the semiconductor package substrate through the fRDL at the die-side interconnect surface; and a semiconductive device disposed on the die side, wherein the semiconductive device is coupled to the fRDL at the die-side interconnect surface, through a trace in the semiconductor package substrate.

In Example 14, the subject matter of any one or more of Examples 1-13 optionally include wherein the integrated cable-header recess is a first integrated cable-header recess, further including a subsequent cable-header recess that communicates to the top surface.

In Example 15, the subject matter of any one or more of Examples 1-14 optionally include wherein the integrated cable-header recess is a first integrated cable-header recess and wherein the fRDL is a first fRDL, further including: a semiconductor package substrate that includes a die side and a land side, wherein the frame stiffener contacts the semiconductor package substrate at the die-side ledge, and wherein the first IRDL is coupled to the die side by a first trace within the semiconductor package substrate; a subsequent integrated cable-header recess that communicates to the top surface, wherein the subsequent integrated cable-header recess is adjacent to a subsequent die-side interconnect surface and adjacent to a subsequent land-side interconnect surface; a subsequent through-frame-stiffener interconnect (TFSI) that communicates from the subsequent land-side interconnect surface, through the frame stiffener and into the subsequent integrated cable-header recess; and a subsequent fRDL coupled to the die side by a subsequent trace within the semiconductor package substrate.

In Example 16, the subject matter of any one or more of Examples 1-15 optionally include wherein the integrated cable-header recess is a first integrated cable-header recess, wherein the land-side interconnect surface is a first land-side interconnect surface, and wherein the die-side interconnect surface is a first die-side interconnect surface, further including: a first folded redistribution layer (fRDL) that is coupled to the frame stiffener body opposite the first integrated cable-header recess at the first land-side interconnect surface, and wherein the first fRDL is also coupled opposite the top surface at the first die-side interconnect surface; a subsequent cable-header recess that communicates to the top surface; a subsequent folded redistribution layer (fRDL) that is coupled to the frame stiffener body opposite the subsequent integrated cable-header recess at the subsequent land-side interconnect surface, and wherein the subsequent fRDL is also coupled opposite the top surface at the subsequent die-side interconnect surface; a first semiconductive device disposed on the die side, wherein the first semiconductive device is coupled to the first fRDL at the first die-side interconnect surface, through a first trace in the semiconductor package substrate; and a subsequent semiconductive device disposed on the die side, wherein the subsequent semiconductive device is coupled to the subsequent fRDL at the subsequent die-side interconnect surface, through a subsequent trace in the semiconductor package substrate.

In Example 17, the subject matter of any one or more of Examples 1-16 optionally include wherein the TFSI is a cable-header TFSI, further including: a cable header electrically coupled to the cable-header TFSI; a semiconductor package substrate including a die side and a land side, wherein the die side is in contact with the die-side ledge; a semiconductive device on the die side, wherein the semiconductive device is coupled to the cable-header TFSI through a folded redistribution layer that contacts the land-side interconnect surface and the die-side interconnect surface; a package-on-package (POP) TFSI that communicates from the die-side ledge to the top surface; and a POP module coupled to the POP TFSI at the top surface.

Example 18 is a method of assembling a frame stiffener, comprising: forming a through hole in a blank; forming a die-side ledge in the blank, wherein the die-side ledge is opposite a top surface forming an integrated cable-header recess adjacent the through hole, wherein the integrated cable-header recess is defined by a die-side interconnect surface and a land-side interconnect surface, and wherein the integrated cable-header recess communicates to the top surface; forming a through-frame-stiffener interconnect (TFSI) in the integrated cable-header recess to communicate to the land-side surface.

In Example 19, the subject matter of Example 18 optionally includes assembling a folded redistribution layer (fRDL) to the die-side interconnect surface and to the land-side interconnect surface; and coupling the fRDL to the TFSI.

In Example 20, the subject matter of any one or more of Examples 18-19 optionally include assembling a folded redistribution layer (fRDL) to the die-side interconnect surface and to the land-side interconnect surface; coupling the fRDL to the TFSI; seating a semiconductor package substrate to the die-side ledge; and coupling the fRDL to the semiconductor package substrate by a trace within the semiconductor package substrate.

Example 21 is a computing system, comprising: a semiconductive die disposed on a semiconductor package substrate; a frame stiffener body including a top surface and a die-side ledge that is opposite the top surface, further including a die-side interconnect surface that is opposite the top surface, and further including a land-side interconnect surface that is parallel planar with the die-side interconnect surface; wherein the semiconductor package substrate contacts the die-side ledge; a through hole that communicates from the top surface to the die-side ledge, and from the top surface to the die-side interconnect surface; an integrated cable-header recess that communicates to the top surface, wherein the integrated cable-header recess is adjacent to the die-side interconnect surface and adjacent to the land-side interconnect surface; wherein the semiconductor package substrate is coupled to the integrated cable-header recess through a folded redistribution layer that contacts the die-side interconnect surface; a through-frame-stiffener interconnect (TFSI) that communicates from the land-side interconnect surface, through the frame stiffener and into the integrated cable-header recess the die side; and a board at which the land side is mounted by at least one electrical bump, and wherein the board includes a dielectric outer shell.

In Example 22, the subject matter of Example 21 optionally includes wherein the semiconductive device is part of a chipset.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R § 1.72(b), to allow the reader to quickly ascertain the nature of the technical disclosure, it is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its oval as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package frame stiffener, comprising:
   a frame stiffener including a top surface and a die-side ledge that is opposite the top surface, further including a die-side interconnect surface that is opposite the top surface, and further including a land-side interconnect surface that is parallel planar with the die-side interconnect surface;
   a through hole that communicates from the top surface to the die-side ledge, and from the top surface to the die-side interconnect surface;
   an integrated cable-header recess that communicates to the top surface, wherein the integrated cable-header recess is adjacent to the die-side interconnect surface and adjacent to the land-side interconnect surface; and
   a through-frame-stiffener interconnect (TFSI) including two or more electrical connections, that communicates from the land-side interconnect surface, through the frame stiffener and into the integrated cable-header recess.

2. The semiconductor package frame stiffener of claim 1, further including a cable header electrically coupled to the TFSI.

3. The semiconductor package frame stiffener of claim 1, further including:
   a cable header electrically coupled to the TFSI; and
   a flexible cable coupled to the cable header.

4. The semiconductor package frame stiffener of claim 1, further including:
   a cable header electrically coupled to the TFSI;
   a flexible cable coupled to the cable header;
   a passive device opposite the integrated cable-header recess, wherein the passive device is coupled to a folded redistribution layer at the land-side interconnect surface;
   a semiconductor package substrate including a die side and a land side, wherein the die side is in contact with the die-side ledge; and
   a semiconductive device on the die side, wherein the semiconductive device is coupled to the TFSI through a folded redistribution layer that contacts the land-side interconnect surface and the die-side interconnect surface.

5. The semiconductor package frame stiffener of claim 1, further including a passive device opposite the integrated cable-header recess, wherein the passive device is coupled to a folded redistribution layer at the land-side interconnect surface.

6. The semiconductor package frame stiffener of claim 1, further including:
   a cable header electrically coupled to the TFSI;
   a semiconductor package substrate including a die side and a land side, wherein the die side is in contact with the die-side ledge; and
   a semiconductive device on the die side, wherein the semiconductive device is coupled to the TFSI through a folded redistribution layer that contacts the land-side interconnect surface and the die-side interconnect surface.

7. The semiconductor package frame stiffener of claim 1, further including:
   a cable header electrically coupled to the TFSI;
   a semiconductor package substrate including a die side and a land side, wherein the die side is in contact with the die-side ledge;
   a semiconductive device on the die side, wherein the semiconductive device is coupled to the TFSI through a folded redistribution layer that contacts the land-side interconnect surface and the die-side interconnect surface; and
   a first stacked semiconductive device on the semiconductive device, wherein the first stacked semiconductive device is coupled to the semiconductive device by a through-silicon via.

8. The semiconductor package frame stiffener of claim 1, further including a folded redistribution layer (fRDL) that is coupled to the frame stiffener opposite the integrated cable-header recess at the land-side interconnect surface, and wherein the fRDL is also coupled opposite the top surface at the die-side interconnect surface.

9. The semiconductor package frame stiffener of claim 1, further including a semiconductor package substrate that, includes a die side and a land side, wherein the frame stiffener contacts the semiconductor package substrate at the die-side ledge.

10. The semiconductor package frame stiffener of claim 1, further including:
    a folded redistribution layer (fRDL) that is coupled to the frame stiffener opposite the integrated cable-header recess at the land-side interconnect surface, and wherein the fRDL is also coupled opposite the top surface at, the die-side interconnect surface; and
    a semiconductor package substrate that includes a die side and a land side, wherein the frame stiffener contacts the semiconductor package substrate at the die-side ledge, and wherein the fRDL is coupled to the die side by a trace within the semiconductor package substrate.

11. The semiconductor package frame stiffener of claim 1, further including:
    a folded redistribution layer (fRDL) that is coupled to the frame stiffener opposite the integrated cable-header recess at the land-side interconnect surface, and wherein the fRDL is also coupled opposite the top surface at, the die-side interconnect surface; and
    a semiconductor package substrate that includes a die side and a land side, wherein the frame stiffener is coupled to the semiconductor package substrate through the fRDL at the die-side interconnect surface.

12. The semiconductor package frame stiffener of claim 1, further including:
    a folded redistribution layer (fRDL) that is coupled to the frame stiffener opposite the integrated cable-header recess at the land-side interconnect surface, and wherein the fRDL is also coupled opposite the top surface at the die-side interconnect surface;

a semiconductor package substrate that includes a die side and a land side, wherein the frame stiffener contacts the semiconductor package substrate at the die-side ledge; and wherein the frame stiffener is coupled to the semiconductor package substrate through the fRDL at the die-side interconnect surface.

13. The semiconductor package frame stiffener of claim 1, further including:
a folded redistribution layer (fRDL) that is coupled to the frame stiffener opposite the integrated cable-header recess at the land-side interconnect surface, and wherein the fRDL is also coupled opposite the top surface at the die-side interconnect surface;
a semiconductor package substrate that includes a die side and a land side, wherein the frame stiffener contacts the semiconductor package substrate at the die-side ledge;
wherein the frame stiffener is coupled to the semiconductor package substrate through the fRDL at the die-side interconnect surface; and
a semiconductive device disposed on the die side, wherein the semiconductive device is coupled to the fRDL at the die-side interconnect surface, through a trace in the semiconductor package substrate.

14. The semiconductor package frame stiffener of claim 13, wherein the integrated cable-header recess is a first integrated cable-header recess and wherein the fRDL is a first fRDL, further including:
a semiconductor package substrate that includes a die side and a land side, wherein the frame stiffener contacts the semiconductor package substrate at the die-side ledge, and wherein the first fRDL, is coupled to the die side by a first trace within the semiconductor package substrate;
a subsequent integrated cable-header recess that communicates to the top surface, wherein the subsequent integrated cable-header recess is adjacent to a subsequent die-side interconnect surface and adjacent to a subsequent land-side interconnect surface;
a subsequent through-frame-stiffener interconnect (TFSI) that communicates from the subsequent land-side interconnect surface, through the frame stiffener and into the subsequent integrated cable-header recess; and
a subsequent fRDL coupled to the die side by a subsequent trace within the semiconductor package substrate.

15. The semiconductor package frame stiffener of claim 1, wherein the integrated cable-header recess is a first integrated cable-header recess, further including a subsequent cable-header recess that communicates to the top surface.

16. The semiconductor package frame stiffener of claim 1, wherein the integrated cable-header recess is a first integrated cable-header recess, wherein the land-side interconnect surface is a first land-side interconnect surface, and wherein the die-side interconnect surface is a first die-side interconnect surface, further including:
a first folded redistribution layer (fRDL) that is coupled to the frame stiffener opposite the first integrated cable-header recess at the first land-side interconnect surface, and wherein the first fRDL, is also coupled opposite the top surface at the first die-side interconnect surface;
a subsequent cable-header recess that communicates to the top surface;
a subsequent folded redistribution layer (fRDL) that is coupled to the frame stiffener opposite the subsequent integrated cable-header recess at the subsequent land-side interconnect surface, and wherein the subsequent fRDL is also coupled opposite the top surface at the subsequent die-side interconnect surface;
a first semiconductive device disposed on the die side, wherein the first semiconductive device is coupled to the first fRDL, at the first die-side interconnect surface, through a first trace in the semiconductor package substrate; and
a subsequent semiconductive device disposed on the die side, wherein the subsequent semiconductive device is coupled to the subsequent fRDL at the subsequent die-side interconnect surface, through a subsequent trace in the semiconductor package substrate.

17. The semiconductor package frame stiffener of claim 1, wherein the TFSI is a cable-header TFSI, further including:
a cable header electrically coupled to the cable-header TFSI;
a semiconductor package substrate including a die side and a land side, wherein the die side is in contact with the die-side ledge;
a semiconductive device on the die side, wherein the semiconductive device is coupled to the cable-header TFSI through a folded redistribution layer that contacts the land-side interconnect surface and the die-side interconnect surface;
a package-on-package (POP) TFSI that communicates from the die-side ledge to the top surface; and
a POP module coupled to the POP TFSI at the top surface.

18. A method of assembling a frame stiffener, comprising:
forming a through hole in a blank;
forming a die-side ledge in the blank, wherein the die-side ledge is opposite a top surface forming an integrated cable-header recess adjacent the through hole, wherein the integrated cable-header recess is defined by a die-side interconnect surface and a land-side interconnect surface, and wherein the integrated cable-header recess communicates to the top surface;
forming a through-frame-stiffener interconnect (TFSI) including two or more electrical connections, in the integrated cable-header recess to communicate to the land-side surface.

19. The method of claim 18, further including:
assembling a folded redistribution layer (fRDL) to the die-side interconnect surface and to the land-side interconnect surface; and
coupling the fRDL to the TFSI.

20. The method of claim 18, further including:
assembling a folded redistribution layer (fRDL) to the die-side interconnect surface and to the land-side interconnect surface;
coupling the fRDL to the TFSI;
seating a semiconductor package substrate to the die-side ledge; and
coupling the fRDL to the semiconductor package substrate by a trace within the semiconductor package substrate.

21. A computing system, comprising:
a semiconductive die disposed on a semiconductor package substrate;
a frame stiffener including a top surface and a die-side ledge that is opposite the top surface, further including a die-side interconnect surface that is opposite the top surface, and further including a land-side interconnect surface that, is parallel planar with the die-side interconnect surface;
wherein the semiconductor package substrate contacts the die-side ledge;

a through hole that communicates from the top surface to the die-side ledge, and from the top surface to the die-side interconnect surface;

an integrated cable-header recess that communicates to the top surface, wherein the integrated cable-header recess is adjacent to the die-side interconnect surface and adjacent to the land-side interconnect surface;

wherein the semiconductor package substrate is coupled to the integrated cable-header recess through a folded redistribution layer that contacts the die-side interconnect surface;

a through-frame-stiffener interconnect (TFSI) that communicates from the land-side interconnect surface, through the frame stiffener and into the integrated cable-header recess the die side; and a board at which the land side is mounted by at least one electrical bump, and wherein the board includes a dielectric outer shell.

22. The computing system of claim 21, further including: wherein the semiconductive device is part of a chipset.

* * * * *